United States Patent
Wanlass

(10) Patent No.: US 6,239,354 B1
(45) Date of Patent: May 29, 2001

(54) ELECTRICAL ISOLATION OF COMPONENT CELLS IN MONOLITHICALLY INTERCONNECTED MODULES

(75) Inventor: Mark W. Wanlass, Golden, CO (US)

(73) Assignee: Midwest Research Institute, Kansas City, MI (US)

( * ) Notice: Subject to any disclaimer, the term of this patent is extended or adjusted under 35 U.S.C. 154(b) by 0 days.

(21) Appl. No.: 09/416,016

(22) Filed: Oct. 8, 1999

Related U.S. Application Data

(60) Provisional application No. 60/103,769, filed on Oct. 9, 1998.

(51) Int. Cl.$^7$ .......................... H01L 31/06; H01L 31/078
(52) U.S. Cl. .......................... 136/249; 136/244; 136/246; 136/262; 136/252; 136/256; 136/255; 257/436; 257/443; 257/448; 257/459; 257/461; 257/466; 438/74; 438/77; 438/80; 438/81; 438/93; 438/94
(58) Field of Search .................. 136/249 MS, 249 TJ, 136/244, 246, 262, 252, 256, 255; 257/436, 443, 448, 459, 461, 466; 438/74, 77, 80, 81, 93, 94

(56) References Cited

U.S. PATENT DOCUMENTS

| | | | |
|---|---|---|---|
| 4,292,092 | * 9/1981 | Hanak | 438/74 |
| 4,633,030 | 12/1986 | Cook . | |
| 4,846,896 | 7/1989 | Hokuyo . | |
| 5,019,177 | * 5/1991 | Wanlass | 136/249 |
| 5,266,125 | 11/1993 | Rand et al. . | |
| 5,322,572 | * 6/1994 | Wanlass | 136/249 |
| 5,389,158 | 2/1995 | Fraas et al. . | |
| 5,593,901 | 1/1997 | Oswald et al. . | |
| 5,616,185 | 4/1997 | Kukulka . | |
| 5,716,459 | * 2/1998 | Chang et al. | 136/249 |
| 5,769,964 | 6/1998 | Charache et al. . | |
| 5,853,497 | 12/1998 | Lillington et al. . | |
| 5,897,715 | * 4/1999 | Ward et al. | 136/244 |
| 6,162,987 | * 12/2000 | Murray et al. | 136/253 |

OTHER PUBLICATIONS

Wilt et al, "Monolithically Interconnected InGaAs TPV Module Development," 25th PVSC, May 13–17, 1996.*

* cited by examiner

Primary Examiner—Alan Diamond
(74) Attorney, Agent, or Firm—Paul J. White; Ken Richardson

(57) ABSTRACT

A monolithically interconnected photovoltaic module having cells which are electrically connected which comprises a substrate, a plurality of cells formed over the substrate, each cell including a primary absorber layer having a light receiving surface and a p-region, formed with a p-type dopant, and an n-region formed with an n-type dopant adjacent the p-region to form a single pn-junction, and a cell isolation diode layer having a p-region, formed with a p-type dopant, and an n-region formed with an n-type dopant adjacent the p-region to form a single pn-junction, the diode layer intervening the substrate and the absorber layer wherein the absorber and diode interfacial regions of a same conductivity type orientation, the diode layer having a reverse-breakdown voltage sufficient to prevent inter-cell shunting, and each cell electrically isolated from adjacent cells with a vertical trench trough the pn-junction of the diode layer, interconnects disposed in the trenches contacting the absorber regions of adjacent cells which are doped an opposite conductivity type, and electrical contacts.

8 Claims, 3 Drawing Sheets

ELECTRICAL ISOLATION OF COMPONENT CELLS IN MONOLITHICALLY INTERCONNECTED MODULES

CROSS-REFERENCE TO RELATED APPLICATION

This application claims the benefit of priority under 35 U.S.C. § 119 to U.S. Provisional Patent Application No. 60/103,769, filed Oct. 9, 1998. The entire contents of U.S. Provisional Patent Application No. 60/103,769 are incorporated herein, as if set forth herein in full.

CONTRACTUAL ORIGIN OF THE INVENTION

The United States Government has rights in this invention pursuant to Contract No. DE-AC36-99GO10337 between the United States Department of Energy and the Midwest Research Institute.

BACKGROUND OF THE INVENTION

1. Field of the Invention

This invention relates to the field direct energy conversion. In particular, it relates to the isolation of component cells in monolithically interconnected modules ("MIM").

2. Description of the Related Art

Thermophotovoltaic ("TPV") energy systems convert thermal energy to electric power using the same principle of operation as solar cells. In particular, a heat source radiatively emits photons that are incident on a semiconductor TPV cell. Photons with an energy greater than the bandgap ($E_g$) of the semiconductor cell excite electrons from the valence band to the conduction band (interband transition). The resultant electron hole pairs (ehp) are then collected by the cell junction. Photo-current/voltage is then available in external metal contacts that can power an electrical load.

The voltage produced across the electrodes of a single TPV cell is, however, insufficient for most applications. To achieve a useful power level from TPV devices, a number of individual photovoltaic cells must be electrically connected in a series/parallel arrangement, which is referred to herein as a photovolatic "module." These modules can be created in a monolithic configuration on a single substrate and, as such, are referred to herein as monolithically interconnected modules ("MIM"). MIMs provide a number of advantages which are useful in the application of TPV systems, including a reduction in joule losses, flexibility in device design and electrical output characteristics, and simplified thermal management and long-wavelength photon recuperation. This later advantage is primarily due to the ease in application of metallic back-surface reflectors ("BSRs") to the substrates. For similar reasons, MIMs have also been used for laser power converters fabricated in $Al_xGa_yIn_{l-x-y}As$ and $Ga_{0.47}In_{0.53}$ As epitaxial layers grown on semi-insulating, Fe-doped InP substrates. Other types of high-intensity photovoltaic converters, such as concentrator solar cells, could also potentially benefit from the advantages of MIM technology TPV MIM development efforts have focused on the implementation of $Ga_{0.47}In_{0.53}As/InP$ double-heterostructure ("DH") converter structures that are epitaxially grown on semi-insulating, Fe-doped in substrates. In this instance, the optical and electrical properties of the (Fe) InP substrates are key to the TPV MIM design. The low free-carrier density allows effective deployment of BSRs, while the high resistivity results in good electrical isolation of the component cells in the MIM.

Thin-film MIMs are typically manufactured by a deposition and patterning method. One example of a suitable technique for depositing a semiconductor material on a substrate is glow discharge in silane, as described, for example, in U.S. Pat. No. 4,064,521. Electrical isolation of the component photocells is typically accomplished with a trench formed through the semiconductor layers and terminating at the semi-insulating substrate, or, when an conductive substrate is used, at an electrically insulating barrier layer. See, e.g. U.S. Pat. No. 5,266,125. Several patterning techniques are conventionally known for forming the trenches separating adjacent photovoltaic cells, including silkscreening with resist masks, etching with positive of negative photoresists, mechanical scribing, electrical discharge scribing, and laser scribing. One objective in forming the trenches is to make them as shallow as possible because deep trenches and barrier layers add to manufacturing costs and made successful MIM processing more difficult. Moreover, electrically isolating the photovoltaic cells using trenches that terminate at or through the substrate precludes the use of certain high performance binary substrates, such as GaSb, which are difficult to render semi-insulating.

SUMMARY OF THE INVENTION

An object of the invention is to provide a method of electrically isolating the junction of component cells that are electrically connected in monolithically interconnected modules.

Another object of the invention is to provide a monolithically interconnected photovoltaic module having isolated cells that are electrically connected on a conductive substrate by utilizing a vertical trench through the pn-junction of a cell isolation diode intervening the substrate and the cell layers.

The objects of this invention are achieved by a monolithically interconnected photovoltaic module having cells which are electrically connected which comprises a substrate, a plurality of solar cells formed over the substrate, each solar cell including a primary absorber layer having a light receiving surface and a p-region, formed with a p-type dopant, and an n-region formed with an n-type dopant adjacent the p-region to form a single pn-junction, and a cell isolation diode layer having a p-region, formed with a p-type dopant, and an n-region formed with an n-type dopant adjacent the p-region to form a single pn-junction, the diode layer intervening the substrate and the cell layers wherein the cell and diode interfacial regions of a same conductivity type orientation, the diode layer having a reverse-breakdown voltage sufficient to prevent inter cell shunting, and each cell junction electrically isolated from adjacent cells with a vertical trench trough the pn-junction of the diode layer, interconnects disposed in the trenches contacting the absorber regions of adjacent cells which are doped an opposite conductivity type, and electrical contacts.

DESCRIPTION OF THE DRAWINGS

The present invention is illustrated by way of example and not limitation in the accompanying figures in which like reference numerals indicate similar elements and in which.

DESCRIPTION OF THE PREFERRED EMBODIMENTS

Unless specifically defined otherwise, all technical or scientific terms used herein have the same meaning as commonly understood by one of ordinary skill in the art to which this invention belongs. Although any methods and materials similar or equivalent to those described herein can be used in the practice or testing of the present invention, the preferred methods and materials are now described.

A novel monolithically interconnected photovoltaic module having cells which are electrically connected, and isolated using a cell isolation diode are described. Electrically isolating the cells does not require a semi-insulating substrate, or barrier layer, but, unlike the prior art, is based on exploiting the reverse-bias characteristics of planar, epitaxially grown-in diodes disposed between the cell junction and the substrate. These diodes in MIMs are referred to herein as cell isolation diodes ("CID"). CIDs are useful in the fabrication of modules on a wide variety of substrates, including conductive substrates, such as GaSb or InAs, which are difficult to render semi-insulating. CIDs are also useful in minimizing the depth of trenches used to separate adjacent cells, and low-bandgap, lattice-mismatched GaInAs MIM processing can remain identical to that for lattice-matched GaInAs MIMs. Moreover, the layers below the CID can be grown undoped to further reduce infared free-carrier absorption.

Figure 1:
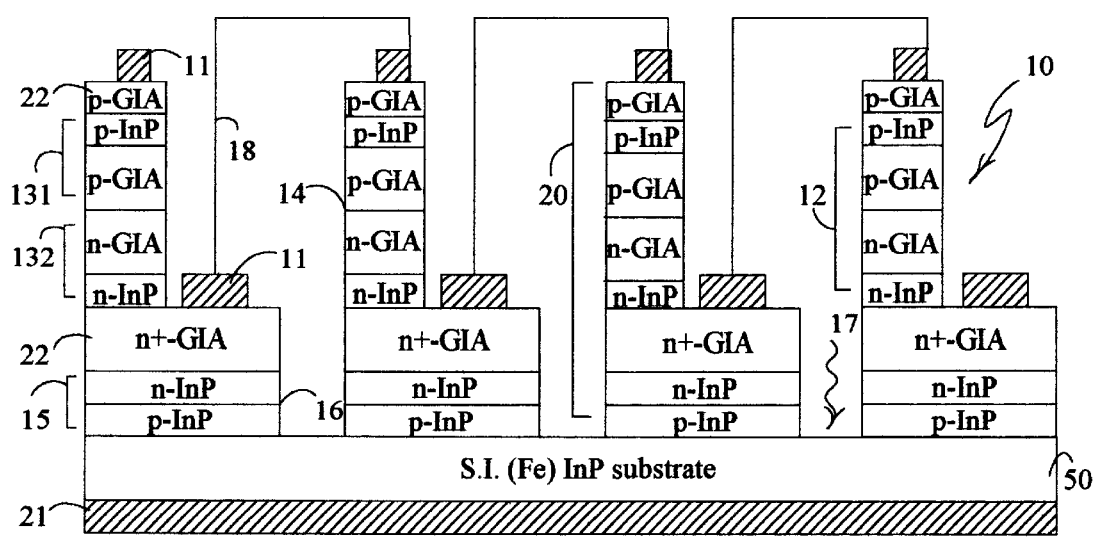
FIG. 1 is a schematic diagram of a preferred photovoltaic module in accord with this invention, showing a plurality of series-connected cells formed over cell isolation diodes on a substrate.

Referring now to the drawing figures, it is generally shown in FIG. 1 a photovoltaic module in accord with the teaching of this invention. Module 10 is comprised of a plurality of cells 20. Each cell includes at least one absorber cell 12 formed, such as by epitaxial growth, on substrate 50. Each absorber layer is made up of semiconductor layers having opposite conductivity type 131 an 132, forming a rectifying junction 14 therebetween. Layers 131 and 132 can, but need not, comprise a double-heterostructure converter (shown in the figure). The cells are electrically isolated from each other by a cell isolation diode 15 having a rectifying junction 16. Trenches 17 are used to separate adjacent cells. Metallic interconnects 18 located in the trenches connect each cell 12 to its neighbor in a series fashion. Electrically, the module illustrated in FIG. 1 represents four cells in series, although more or fewer cells may be used in a series/parallel connectivity depending on the desired output current-voltage characteristics for the module in a particular application. Contacts 11, are located on the contact layers 22 of module 10 and provide means for electrically connecting the module.

Figure 2:
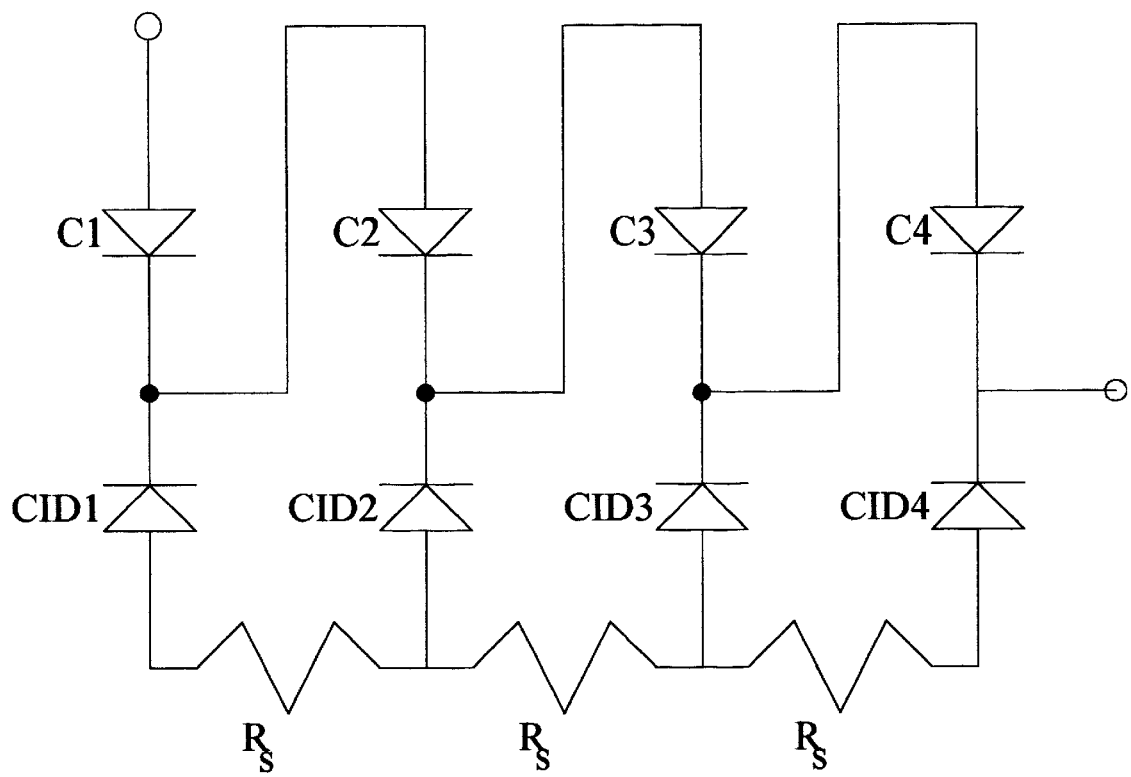
FIG. 2 is layout of the circuit equivalent to the device set forth in FIG. 1.

Referring now to FIG. 2, when the solar cells are connected in series the open-circuit voltage of the cells is determined by the number of cells C1–C4 in the module. The cells are electrically isolated from each other by cell isolation diodes CID1–CID4 having resistance's Rs between each diode. The current-blocking, reverse-bias characteristics of the cell isolation diodes CID1–CID4 isolate the cells to prevent inter-cell shunting.

Referring once again to FIG. 1, the cells are separated from each other by vertical trenches 17, which are preferably parallel, equally spaced and extend across one full dimension of the module and vertically to the CID layer pn-junction 16. This feature is distinctly different in that it eliminates the need for an insulating layer on conductive substrates.

Interconnects 18 are located in the trenches and provide for electrical series connection between adjacent cells. The interconnects can be of any material which is well known in the art. The interconnect material must make ohmic contact with both oppositely doped regions 131 and 132 of the cells.

External contacts 11, can extend the length of the module, are parallel to the cells, and are in electrical connection with the oppositely doped regions 132 and 131 of cells 20. High-reflectance BSRs 21 can be used for efficient recuperation of sub-bandgap energy photons in order to achieve high TPV system conversion efficiencies.

EXPERIMENT

The general methods used to fabricate the MIMs can be by any method well known in the art, but the method used in this example was described more fully in Ward, J. S. et al., A Novel Design for Monolithically Interconnected Modules (MIMs) for Thermophotovoltaic (TPV) Power Conversion, Proc. $3^{rd}$ NREL Conf. on Thermophotovoltaic Generation of Electricity, AIP Conf. Proc. Vol. 401, pp. 227–236, 1997.

Module solar cell epilayers were grown using atmospheric-pressure metalorganic vapor phase epitaxy ("APMOVPE") in a vertically oriented reactor vessel. This growth process has been described in U.S. Pat. No. 4,649,859 which is incorporated by reference. The growth ambient was palladium-purified hydrogen and the growth temperature was fixed at 620° C. Ethyldimethylindium, triethylgallium, arsine, and phosphine were used as the primary reactants. Diethylzinc, bis(cyclopentadienyl)magnesium, and hydrogen sulfide were used as dopant precursors. Zn-doped ($N_A \sim 3 \times 10^{18} cm^{-3}$) or Fe-doped (semi-insulating) InP substrates prepared with an epi-ready surface were used for all growths.

Diagnostic device arrays and MIMs were fabricated using standard photolithography and selective wet-chemical processing techniques which are well known in the art. Low-resistance front grid metallizations were formed on the heavily doped $n^+$- and $p^+$-$Ga_{0.43}In_{0.53}As$ surfaces by electroplating pure Au. Back contacts to $p^+$-InP substrates consisted of a multilayer electroplated Au/Zn/Au sandwich that was sintered at ~395° C. for 1 min. to achieve a low specific contact resistance.

Figure 3:
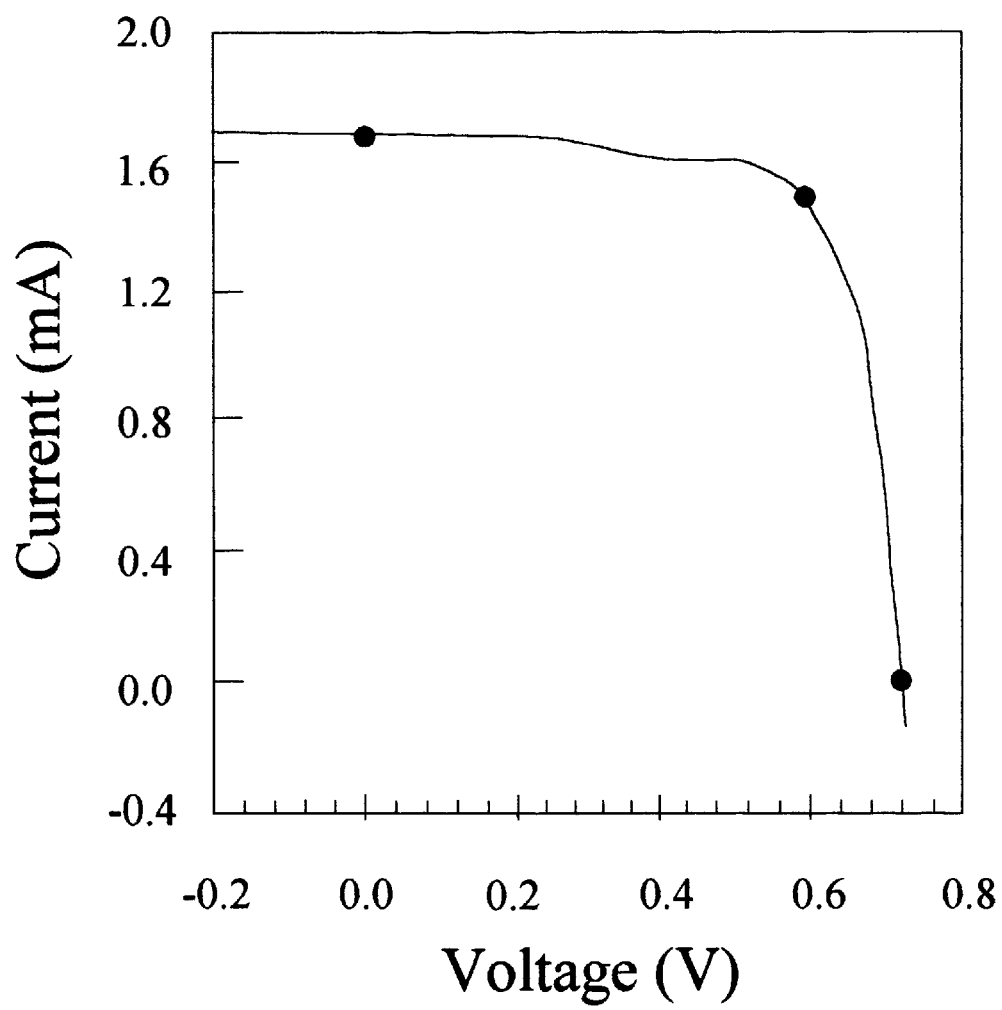
FIG. 3 is a graph of the current voltage data for a TPV GaInAs MIM.

Room temperature (24.6° C.) current-voltage data for a representative two-cell TPV GaInAs MIM (area=0.1606$cm^2$) operated under high-intensity illumination are given in FIG. 3. These data yield the following results: $V_{oc}$=0.7206; $I_{sc}$=1.678 mA; $J_{sc}$=10.45 $mAcm^{-2}$; FF=72.66%; $V_{max}$=0.5895 V; $I_{max}$=1.491 mA; and $P_{max}$=0.8788 mW. These data show that the CID provides excellent electrical isolation between the component cells.

While the present invention has been illustrated and described with reference to particular structures and methods of fabrication, it will be apparent that other changes and modifications can be made therein with the scope of the present invention as defined by the appended claims.

I claim:

1. A monolithically interconnected photovoltaic module having cells which are electrically series connected comprising:
   (a) a substrate;
   (b) a plurality of cells formed over the substrate, each cell including a primary absorber layer having a light receiving surface and a p-region, formed with a p-type dopant, and an n-region formed with an n-type dopant adjacent the p-region to form a single pn-junction, and a cell isolation diode layer having a p-region, formed with a p-type dopant, and an n-region formed with an n-type dopant adjacent the p-region to form a single pn-junction, the diode layer intervening the substrate and the cell layer wherein the absorber and diode interfacial regions are of a same conductivity type orientation, the diode layer having a reverse-breakdown voltage sufficient to prevent inter-cell shunting, and each cell junction electrically isolated from adjacent cells with a vertical trench through the pn-junction of the diode layer to the substrate;

(c) interconnects disposed in the trenches contacting the absorber regions of adjacent cells which are doped an opposite conductivity type; and (d) electrical contacts.

2. The monolithically interconnected photovoltaic module of claim 1 wherein the absorber layer comprises a low-bandgap double-heterostructure PV semiconductor, including in optical alignment a first InP n-layer formed with an n-type dopant, a $Ga0.47In_{0.53}As$ layer having an n-region, formed with an n-type dopant, and an p-region formed with a p-type dopant to form a single pn-junction, and a second InP p-layer formed with a p-type dopant, the cell, the diode and an InP absorber layer interfacing in an orientation of the same conductivity type.

3. The monolithically interconnected photovoltaic module of claim 1 further comprising a back surface reflector disposed beneath the substrate.

4. The monolithically interconnected photovoltaic module of claim 1 wherein the substrate is semi-insulating.

5. The monolithically interconnected photovoltaic module of claim 3 wherein the substrate is InP.

6. The monolithically interconnected photovoltaic module of claim 1 wherein the substrate is conductive.

7. The monolithically interconnected photovoltaic module of claim 5 wherein the substrate is selected from the group consisting of GaSb and InAs.

8. A method of electrical isolation of component cells in monolithically interconnected modules, comprising: forming a substrate;

(a) forming a substrate;

(b) growing a plurality of cells over the substrate, each cell including a primary absorber layer having a light receiving surface and a p-region, formed with a p-type dopant, and an n-region formed with an n-type dopant adjacent the p-region to form a single pn-junction, and a cell isolation diode layer having a p-region, formed with a p-type dopant and an n-region formed with an n-type dopant adjacent the p-region to form a single pn-junction, the diode layer intervening the substrate and the absorber layer wherein the absorber and diode interfacial regions are in a same conductivity type orientation, the diode layer having a reverse-breakdown voltage sufficient to prevent inter-cell shunting;

(c) electrically isolating each cell from an adjacent cell with a vertical trench trough the pn-junction of the diode layer to the substrate; and (d) forming electrical contacts on the cells and interconnecting the absorber regions of adjacent cells which are doped the opposite conductivity type.

* * * * *